United States Patent [19]

Sekino et al.

[11] Patent Number: 4,599,599
[45] Date of Patent: Jul. 8, 1986

[54] ANALOG-TO-DIGITAL CONVERTER

[75] Inventors: Takeo Sekino, Atsugi; Masashi Takeda, Isehara, both of Japan

[73] Assignee: Sony Corporation, Tokyo, Japan

[21] Appl. No.: 400,058

[22] Filed: Jul. 20, 1982

[30] Foreign Application Priority Data

Jul. 21, 1981 [JP] Japan ................... 56-113901
Nov. 16, 1981 [JP] Japan ................... 56-183510

[51] Int. Cl.$^4$ ............................................. H03K 5/153
[52] U.S. Cl. ................................ 340/347 AD; 307/361
[58] Field of Search ............. 340/347 AD; 324/99 D; 307/360, 361

[56] References Cited

U.S. PATENT DOCUMENTS 4,417,233 11/1983 Inoue ........................ 340/347 AD

FOREIGN PATENT DOCUMENTS 1602301 11/1981 United Kingdom ........ 340/347 AD

*Primary Examiner*—Charles D. Miller
*Attorney, Agent, or Firm*—Lewis H. Eslinger; Alvin Sinderbrand

[57] ABSTRACT

An analog-to-digital converter for converting an analog input signal to a digital output signal with m upper bits and n lower bits includes at least $2^{m+n}-1$ resistors connected in a series circuit to a voltage source for establishing respective reference voltages; switch elements selectively coupled to the analog input signal and the resistors in response to a switch control signal for supplying a signal indicative of the analog input signal and the respective reference voltages; at least $2^m-1$ upper bit comparators for generating the switch control signal and output signals indicative of the m upper bits, with first inputs receiving the analog input signal and second inputs connected to the series circuit at intervals defining groups of the resistors; an upper bit encoder receiving the output signals from the upper bit comparators and generating the m upper bits; at least $2^n-1$ lower bit comparators for generating output signals indicative of the n lower bits, having first and second inputs connected to the switch elements whereby the switch elements selectively supply the signal indicative of the analog input signal to the first inputs and selectively connect the second inputs to the respective resistors in response to the switch control signal; and a lower bit encoder receiving the output signal from the lower bit comparators for generating the n lower bits.

25 Claims, 10 Drawing Figures

FIG. 5

ANALOG-TO-DIGITAL CONVERTER

BACKGROUND OF THE INVENTION

1. Field of the Invention

This invention relates to an analog-to-digital converter, and more particularly, to a compact, high speed analog-to-digital converter.

2. Description of the Prior Art

Prior art analog-to-digital converters can generally be classified as either parallel-type converters or serial-to-parallel type converters.

Parallel-type analog-to-digital converters which produce n bit digital outputs generally require ($2^n-1$) comparing circuits or comparators connected in parallel. An analog input voltage is supplied to the ($2^n-1$) voltage comparators, and the outputs from the comparators are supplied to an encoder which then produces the n digit output.

In a serial-to-parallel type analog-to-digital converter having an output of m upper bits and n lower bits, the input voltage is supplied to a first stage of ($2^m-1$) voltage comparing circuits or comparators, just as in the parallel-type analog-to-digital converter, to generate the m upper bits. The m upper bits are then supplied to a digital-to-analog converter and reconverted to an analog voltage. The reconverted analog voltage is then subtracted from the analog input voltage and the difference is supplied to a second stage of ($2^n-1$) voltage comparators to derive the n lower bits.

In the parallel-type analog-to-digital converter, ($2^n-1$) voltage comparators are required when the analog input voltage is converted to a digital output of n bits. A large number of circuit elements are required for such an analog-to-digital converter, and the resulting integrated circuit is large and has a correspondingly large power consumption.

In the serial-to-parallel analog-to-digital converter, only ($2^m+2^n-2$) voltage comparators are used when the output has m +n bits. The chip size and power consumption are reduced as compared to the parallel-type analog-to-digital converter. However, a serial-to-parallel analog-to-digital converter requires a digital-to-analog converter. If an error occurs between the first and second stages of the converter, the error is repeated in the digital output. For example, with a monotonically increasing voltage $V_{in}$, if an error occurs between the first and second stages so that the output from the first stage is reduced, the digital output from the second stage will be reduced, and the digital output of the converter will not increase monotonically.

OBJECTS AND SUMMARY OF THE INVENTION

Accordingly, it is an object of the present invention to provide an analog-to-digital converter which does not have the aforesaid problems of prior art analog-to-digital converters.

It is another object of the present invention to provide an analog-to-digital converter on a semiconductor pellet which is a compact, integrated circuit.

It is still another object of the present invention to provide a high speed analog-to-digital converter.

It is still a further object of the present invention to provide a low power consumption analog-to-digital converter.

In accordance with one aspect of the present invention, an analog-to-digital converter for converting an analog input signal to a digital output signal of m upper bits and n lower bits includes at least $2^{m+n}-1$ resistors connected in a series circuit to a voltage source for establishing respective reference voltages. Switch elements are selectively coupled to the analog input signal and the resistors by a switch control signal and supply a signal indicative of the analog input signal and the reference voltages. A plurality of upper bit comparators for generating the switch control signal and output signals indicative of the m upper bits have first inputs receiving the analog input signal and second inputs connected to the series circuit at intervals defining groups of the resistors. An upper bit encoder receives the output signals from the upper bit comparators and generates the m upper bits. A plurality of lower bit comparators for generating outputs indicative of the n lower bits have first and second inputs connected to the switch elements whereby the switch elements selectively supply the signal indicative of the analog input signal to the first inputs of the lower bit comparators and selectively connect the second inputs to the respective resistor groups in response to the switch control signal. A lower bit encoder receives the outputs from the lower bit comparators and generates the n lower bits.

The above, and other objects, features and advantages of the invention will be apparent from the following detailed description of illustrative embodiments thereof which is to be read in connection with the accompanying drawings.

BRIEF DESCRIPTION OF THE DRAWINGS

FIGS. 4A and 4B are truth tables of encoders illustrated in FIG. 3;

FIG. 5 is a block diagram illustrating an alternate embodiment of an analog-to-digital converter in accord with the invention;

DESCRIPTION OF THE PREFERRED EMBODIMENTS

Figure 1:
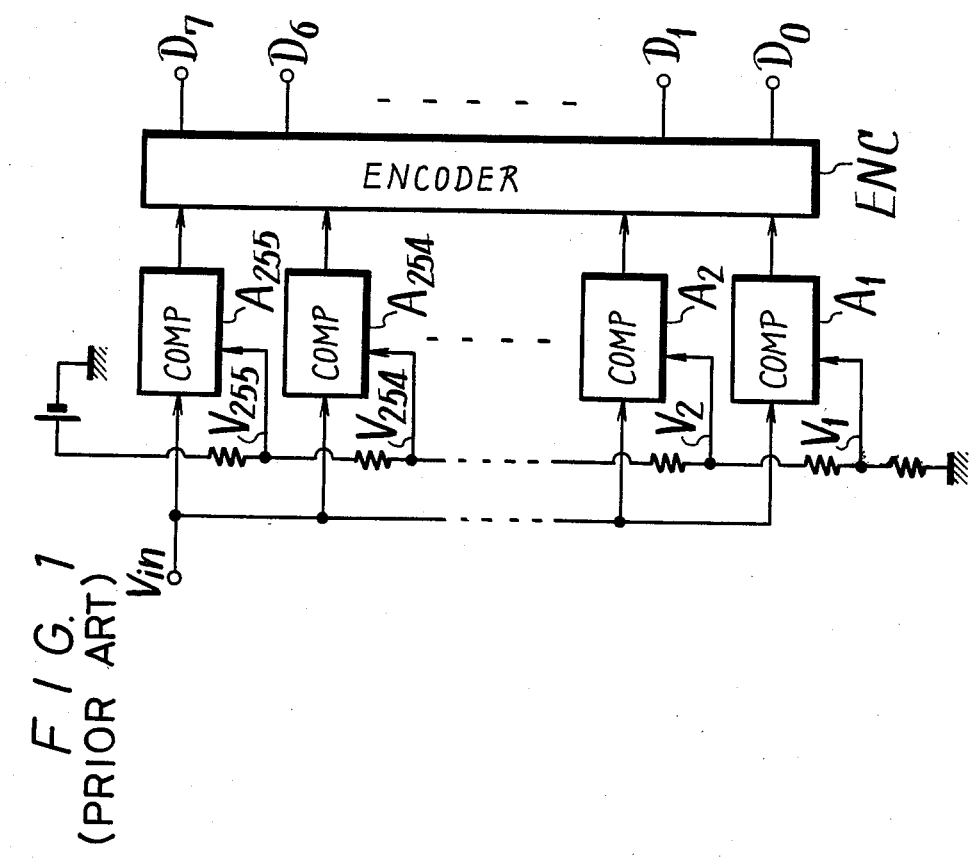
FIG. 1 is a block diagram illustrating a prior art parallel-type analog-to-digital converter.

Referring initially to FIG. 1, a parallel-type analog-to-digital converter known in the prior art is disclosed in which an analog input voltage $V_{in}$ is converted to an 8 bit digital output $D_0$ to $D_7$. The parallel-type analog-to-digital converter of FIG. 1 has 255 voltage comparing circuits or comparators $A_1$ to $A_{255}$, providing 255 reference voltage steps $V_1$ to $V_{255}$. Analog input voltage $V_{in}$ is compared with each of reference voltages $V_1$ to $V_{255}$, and outputs from comparator circuits $A_1$ to $A_{255}$ are supplied to an encoder ENC which generates digital outputs $D_0$ to $D_7$.

Figure 2:
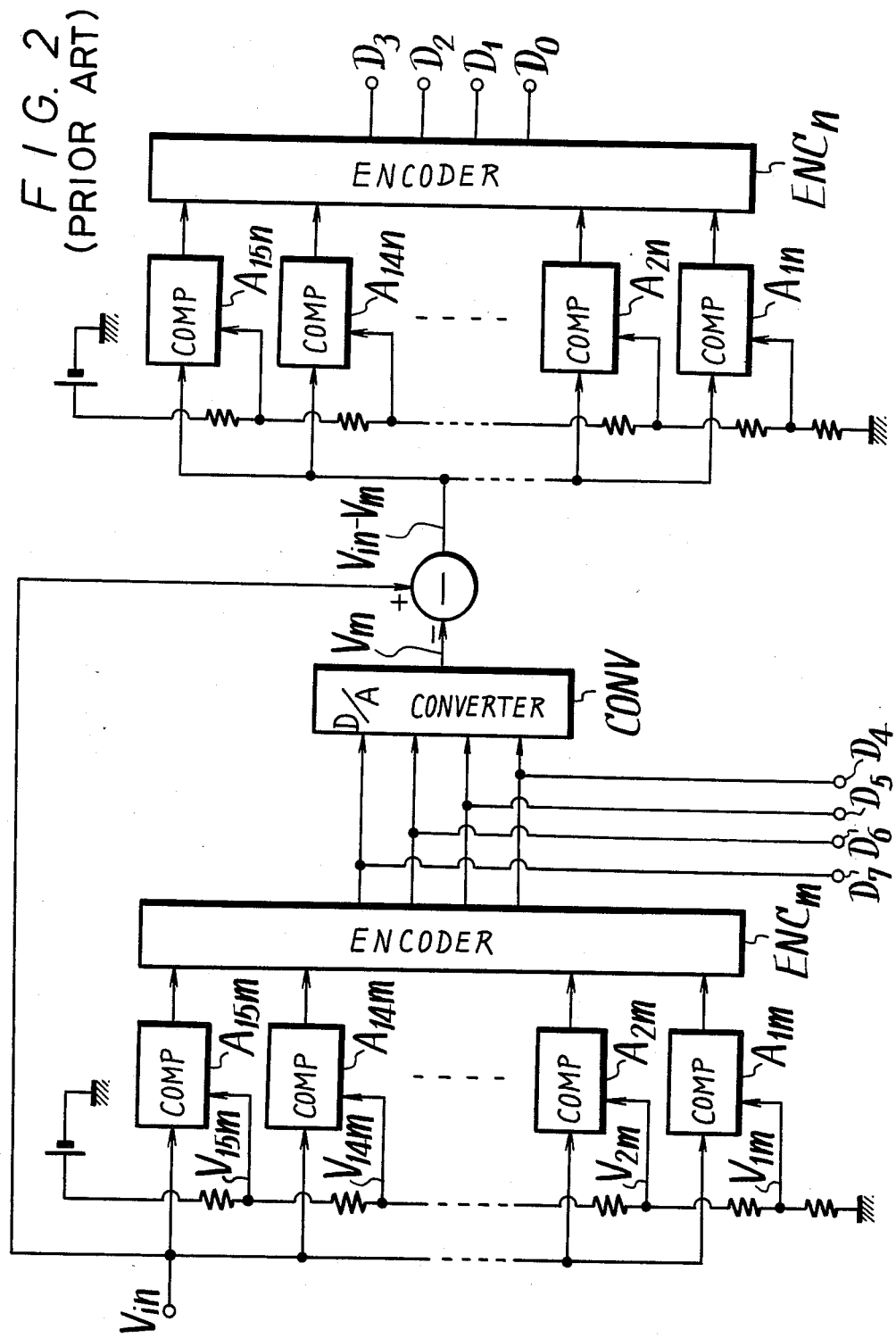
FIG. 2 is a block diagram illustrating a prior art serial-to-parallel analog-to-digital converter.

In FIG. 2, a serial-to-parallel type analog-to-digital converter is shown in which analog input voltage $V_{in}$ is converted to a digital output voltage of n lower bits and m upper bits. In the illustrative embodiment, the n lower bits are denoted as $D_0$ to $D_3$, while the m upper bits are denoted as $D_4$ to $D_7$. Input voltage $V_{in}$ is supplied to a first or front stage of the serial-to-parallel type analog-to-digital converter having comparison circuits or comparators $A_{1m}$ to $A_{15m}$ and corresponding voltage steps $V_{1m}$ to $V_{15m}$, from which outputs are supplied to upper bit encoder ENCM which generates m upper bits $D_4$ to $D_7$. Upper bits $D_4$ to $D_7$ are supplied to a digital-to-analog converter CONV where they are reconverted to an analog voltage $V_m$. Analog voltage $V_m$ is then subtracted from input voltage $V_{in}$, and the difference is supplied to a second or rear stage of the serial-to-parallel type analog-to-digital converter. The second stage has comparison circuits $A_{1n}$ to $A_{15n}$ and corresponding voltage steps $V_{1n}$ to $V_{15n}$, and supplies outputs to a second encoder ENCN, which generates n lower bits $D_0$ to $D_3$.

Figure 3:
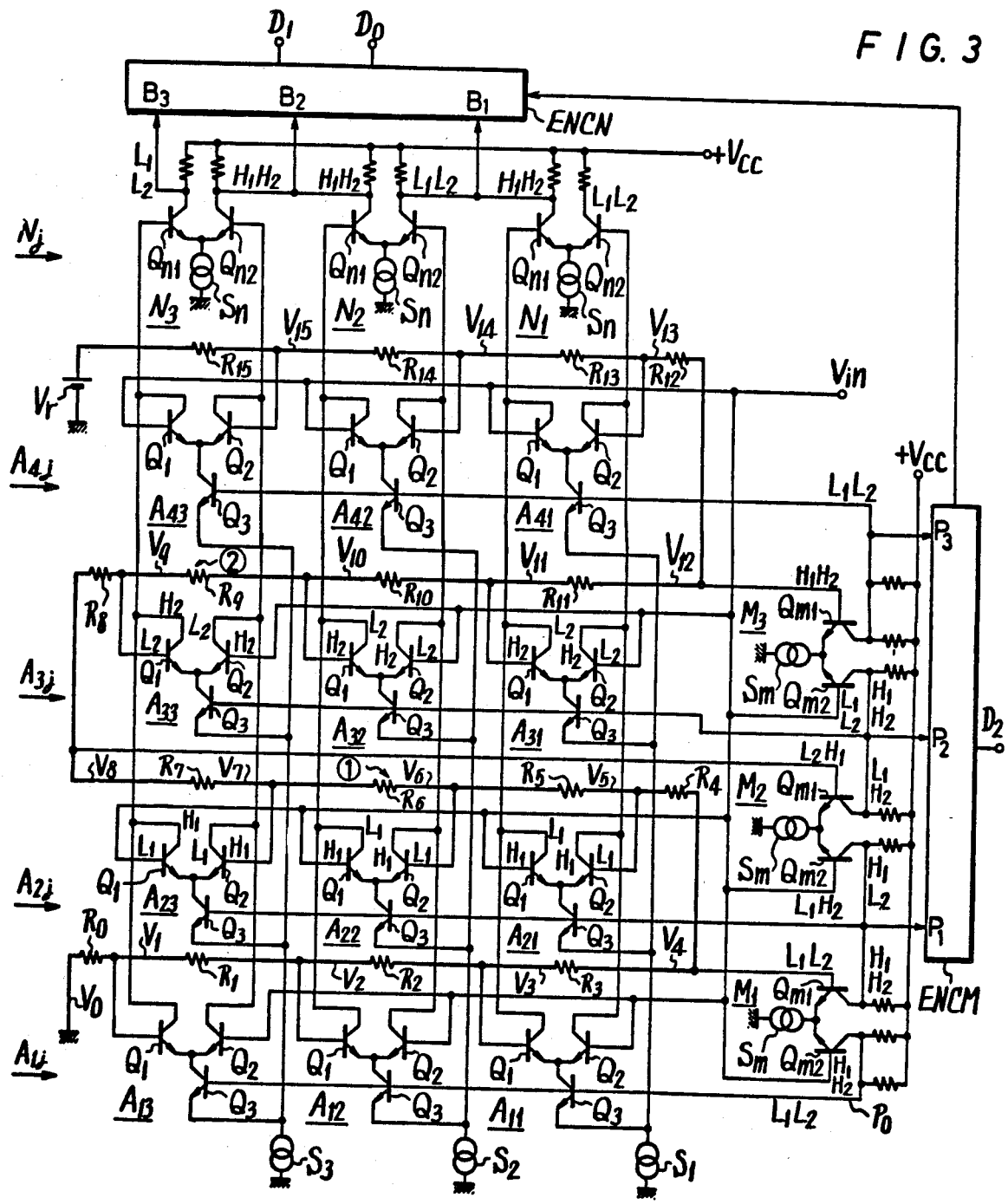
FIG. 3 illustrates an embodiment of an analog-to-digital converter in accord with the present invention.

Referring to the embodiment of the invention illustrated in FIG. 3, three upper bit voltage comparators or coarse comparators $M_1$, $M_2$, and $M_3$ are arranged on one side of resistors $R_0$ to $R_{15}$ and have emitters of transistors $Q_{m1}$ and $Q_{m2}$ connected together to a constant current source $S_m$. Three lower bit voltage comparators or fine comparators $N_1$, $N_2$ and $N_3$ are arranged on another side of resistors $R_0$ to $R_{15}$ and have emitters of transistors $Q_{n1}$ and $Q_{n2}$ connected together to a constant current source $S_n$.

Voltage comparators $A_{ij}$ (where i equals 1 to 4 and j equals 1 to 3) have emitters of transistors $Q_1$ and $Q_2$ connected together to a collector of a current switching transistor $Q_3$. Each row of voltage comparators $A_{i1}$ to $A_{i3}$ (i equals 1 to 4) functions as a first stage comparator of fine comparators $N_1$, $N_2$ and $N_3$, since analog input voltage $V_{in}$ is compared to reference voltages $V_i$ (i equals 1 to 15) in voltage comparators $A_{i1}$ to $A_{i3}$.

Resistors $R_0$ to $R_{15}$ having equivalent resistance values are connected in series as a resistor string between a reference voltage source $V_r$ and ground to supply sixteen reference voltages $V_0$ to $V_{15}$. Every fourth step of the reference voltages $V_0$ to $V_{15}$, i.e., voltages $V_4$, $V_8$ and $V_{12}$, are supplied to bases of transistors $Q_{m1}$ in coarse comparators $M_1$, $M_2$ and $M_3$. Voltages $V_{13}$ to $V_{15}$ and $V_5$ to $V_7$ are supplied to bases of transistors $Q_2$ in coarse comparators $A_{2j}$ and $A_{4j}$ (j equals 1 to 3). Voltages $V_9$ to $V_{11}$ and $V_1$ to $V_3$ are supplied to bases of transistors $Q_1$ of voltage comparators $A_{1j}$ and $A_{3j}$ (j equals 1 to 3). Analog input voltage $V_{in}$ is supplied to bases of transistors $Q_{m2}$ of coarse comparators $M_1$, $M_2$ and $M_3$, to bases of transistors $Q_2$ of voltage comparators $A_{1j}$ (j equals 1 to 3) and $A_{3j}$ (j equals 1 to 3), and to bases of transistors $Q_1$ of voltage comparators $A_{2j}$ (j equals 1 to 3) and $A_{4j}$ (j equals 1 to 3).

A collector output $P_3$ of transistor $Q_{m1}$ of coarse comparator $M_3$ is supplied to the bases of transistors $Q_3$ of voltage comparators $A_{4j}$ (j equals 1 to 3). A wired-AND output $P_2$ from outputs of collectors of transistor $Q_{m2}$ of coarse comparator $M_3$ and transistor $Q_{m1}$ of coarse comparator $M_2$ is supplied to bases of transistors $Q_3$ of comparator $A_{3j}$ (j equals 1 to 3). A wired-AND output $P_1$ from outputs of collectors of transistors $Q_{m2}$ of coarse comparator $M_2$ and transistor $Q_{m1}$ of coarse comparator $M_1$ is supplied to bases of transistors $Q_3$ of comparator $A_{2j}$ (j equals 1 to 3). A collector output $P_0$ of transistor $Q_{m2}$ of coarse comparator $M_1$ is supplied to bases of transistors $Q_3$ of comparator $A_{1j}$ (j equals 1 to 3). Emitters of transistors $Q_3$ of comparators $A_{i1}$ (i equals 1 to 4) are connected to constant current source $S_1$. Emitters of transistors $Q_3$ of comparators $A_{i2}$ (i equals 1 to 4) are connected to constant current source $S_2$. Emitters of transistors $Q_3$ of comparators $A_{i3}$ (i equals 1 to 4) are connected to constant current source $S_3$. Outputs $P_1$ to $P_3$ of coarse comparators $M_1$ to $M_3$ are supplied to an upper bit encoder or coarse encoder ENCM which generates upper bits $D_2$ and $D_3$ of the digital output. Coarse bit encoder ENCM also supplies a control signal to a lower bit or fine bit encoder ENCN, as will be described more fully hereinbelow.

Collectors of transistors $Q_1$ and $Q_2$ of comparators $A_{i1}$ to $A_{i3}$ (i equals 1 to 4) are connected to bases of transistors $Q_{n1}$ and $Q_{n2}$, respectively, of fine comparators $N_1$ to $N_3$. A collector output $B_3$ of transistor $Q_{n1}$ of fine comparator $N_3$ is supplied to fine bit encoder ENCN. A wired-AND output $B_2$ from outputs of collectors of transistor $Q_{n2}$ of fine comparator $N_3$ and transistor $Q_{n1}$ of fine comparator $N_2$ is supplied to fine bit encoder ENCN. A wired-AND output $B_1$ from the outputs of collectors of transistor $Q_{n2}$ of comparator $N_2$ and transistor $Q_{n1}$ of comparator $N_1$ is supplied to fine bit encoder ENCN. Bit $D_2$ from coarse bit encoder ENCM is also supplied to fine bit encoder ENCN, and its function will be described more fully below. Fine bit encoder ENCN supplies lower 2-bits $D_0$ and $D_1$ of the digital output.

FIG. 4A illustrates the truth tables for the coarse bit encoder ENCM, while FIG. 4B illustrates the truth tables for fine bit encoder ENCN. The truth table of FIG. 4A indicates the values of bits $D_2$ and $D_3$ for given values of outputs $P_0$ to $P_3$. The truth table of FIG. 4B indicates the values of bits $D_0$ and $D_1$ for given values of outputs $B_1$ to $B_3$ and bit $D_2$.

The operation of the illustrative embodiment will now be described with reference to FIG. 3, in which an analog input voltage $V_{in}$ is less than reference voltage $V_7$, is greater than reference voltage $V_6$, and is equal to the reference voltage at the point 1 between resistors $R_6$ and $R_7$ of FIG. 3. For the following description, the letters "H" and "L" are used to indicate the high or low levels, respectively, of a signal, and include a subscript 1 to indicate the reference voltage $V_{in}$ at point 1.

Since analog input voltage $V_{in}$ is less than reference voltage $V_8$ and further less than reference voltage $V_{12}$, the bases of transistors $Q_{m1}$ of coarse comparators $M_2$ and $M_3$ become "$H_1$", and the bases of transistors $Q_{m2}$ of coarse comparators $M_2$ and $M_3$ become "$L_1$", so that the collectors of transistors $Q_{m1}$ become "$L_1$". Since analog input voltage $V_{in}$ is greater than reference voltage $V_4$, the base of transistor $Q_{m1}$ of coarse comparator $M_1$ becomes "$L_1$", and the base of transistor $Q_{m2}$ becomes "$H_1$", so that the collector of transistor $Q_{m1}$ becomes "$H_1$" and the collector of transistor $Q_{m2}$ becomes "$L_1$". With collector output $P_0$ equal to "$L_1$", collector output $P_1$ equal to "$H_1$", collector outputs $P_2$ and $P_3$ equal to "$L_1$" (from the operation of the wired-AND between "$L_1$" and "$H_1$" producing an output of "$L_1$"), the second row of the truth table of FIG. 4A indicates that bit $D_2$ is equal to "1", and bit $D_3$ is equal to "0".

With collector outputs $P_0$ to $P_3$ equal to "$L_1$", "$H_1$", "$L_1$" and "$L_1$", respectively, transistors $Q_3$ of comparators $A_{2j}$ (j equals 1 to 3) are made on, so that analog input voltage $V_{in}$ is compared with reference voltages $V_5$ to $V_7$ in comparators $A_{2j}$. Since analog input voltage $V_{in}$ is less than reference voltage $V_7$ and greater than reference voltage $V_6$, the base of transistor $Q_1$ of comparator $A_{23}$ becomes "$L_1$", and the base of transistor $Q_2$ becomes "$H_1$", so that the collector of transistor $Q_1$ becomes "$H_1$" and the collector of transistor $Q_2$ becomes "$L_1$". With the bases of transistors $Q_1$ of comparators $A_{21}$ and $A_{22}$ equal to "$H_1$", and the bases of transistors $Q_2$ equal to "$L_1$", the collectors of transistors $Q_1$ become "$L_1$" and the collectors of transistors $Q_2$ become "$H_1$".

The above-identified outputs are supplied to fine comparators $N_1$ to $N_3$, so that the collector of transistor $Q_{n1}$ of fine comparator $N_3$ becomes "$L_1$", the collector of transistor $Q_{n2}$ becomes "$H_1$", the collectors of transistors $Q_{n1}$ of fine comparators $N_1$ and $N_2$ become "$H_1$", and the collectors of transistors $Q_{n2}$ become "$L_1$". Accordingly, collector output $B_1$ is equal to "$L_1$", collector output $B_2$ is equal to "$H_1$", and collector output $B_3$ is equal "$L_1$". The seventh row of the truth table of FIG. 4B indicates that bit $D_1$ is equal to "1" and bit $D_0$ is equal to "0" when bit $D_2$ is equal to "1".

As a check on the above calculation, it is to be noted that analog input voltage $V_{in}$ is the sixth step in the series circuit of resistors, with the zero step being the ground side. The decimal number six is the binary number "0110". From the discussion above, the digital outputs $D_3$ to $D_0$ are "0110".

By way of a second example, analog input voltage $V_{in}$ is equal to the electric potential in the series circuit of resistors $R_0$ to $R_{15}$ at the point 2, and is less than reference voltage $V_{10}$ and greater than reference voltage $V_9$.

Since analog input voltage $V_{in}$ is less than reference voltage $V_{12}$, the base of transistor $Q_{m1}$ of coarse comparator $M_3$ becomes "$H_2$", and the base of transistor $Q_{m2}$ becomes "$L_2$", so that the collector of transistor $Q_{m1}$ becomes "$L_2$" and the collector of transistor $Q_{m2}$ becomes "$H_2$". Since analog input voltage $V_{in}$ is greater than reference voltages $V_8$ and $V_4$, the bases of transistors $Q_{m1}$ of comparators $M_1$ and $M_2$ become "$L_2$" and the bases of transistors $Q_{m2}$ become "$H_2$", so that the collectors of transistors $Q_{m1}$ become "$H_2$" and the collectors of transistors $Q_{m2}$ become "$L_2$". Accordingly, collector output $P_0$ is equal to "$L_2$", collector output $P_1$ is equal to "$L_2$", collector output $P_2$ is equal to "$H_2$", and collector output $P_3$ is equal to "$L_2$". From the third row of the truth table of FIG. 4A, digital output $D_3$ is equal "1" and digital output $D_2$ is equal "0".

With the collector outputs $P_0$ to $P_3$ equal to "$L_2$", "$L_2$", "$H_2$" and "$L_2$", respectively, only transistors $Q_3$ of comparators $A_{3j}$ (j equals 1 to 3) are made on, so that analog input voltage $V_{in}$ is compared with reference voltages $V_9$ to $V_{11}$ in comparators $A_{3j}$. Since analog input voltage $V_{in}$ is greater than reference voltage $V_9$ and less than reference voltage $V_{10}$, the base of transistor $Q_1$ of comparator $A_{33}$ becomes "$L_2$", the base of transistor $Q_2$ becomes "$H_2$", so that the collector of transistor $Q_1$ becomes "$H_2$" and the collector of transistor $Q_2$ becomes "$L_2$". The bases of transistors $Q_1$ of comparators $A_{31}$ and $A_{32}$ become "$H_2$", and the bases of transistors $Q_2$ become "$L_2$", so that the collectors of transistors $Q_1$ become "$L_2$" and the collectors of transistors $Q_2$ become "$H_2$".

With the above-mentioned outputs supplied to fine comparators $N_1$ to $N_3$, the collector of transistor of $Q_{n1}$ of fine comparator $N_3$ is "$L_2$", the collector of transistor $Q_{n2}$ of fine comparator $N_3$ is "$H_2$", the collectors of transistors $Q_{n1}$ of fine comparators $N_2$ and $N_1$ become "$H_2$", and the collectors of transistors $Q_{n2}$ of fine comparators $N_1$ and $N_2$ become "$L_2$". With outputs $B_1$ to $B_3$ equal to "$L_2$", "$H_2$" and "$L_2$", respectively, from the operation of the wired-AND outputs $B_2$ and $B_1$, the second row of the truth table of FIG. 4B indicates digital output $D_1$ is equal to "0" and digital output $D_0$ is equal "1", when digital output $D_2$ is equal to "0".

The accuracy of the values for outputs $D_3$ to $D_0$ can be confirmed by noting that analog input voltage $V_{in}$ is the ninth step of the series circuit of resistors $R_0$ to $R_{15}$. Decimal number nine is the same as binary number "1001", which corresponds to digital outputs $D_3$ to $D_0$.

When an analog-to-digital converter is formed with resistors $R_0$ to $R_{15}$ in a zigzag pattern, the reference voltage increases from left to right, as shown in FIG. 3, in resistor strings $R_0$ to $R_3$ and $R_8$ to $R_{11}$ (hereinafter referred to as group A), and decreases from left to right in resistor strings $R_4$ to $R_7$ and $R_{12}$ to $R_{15}$ (hereinafter referred to as group B). Since the reference bias conditions of the resistor strings of group A differ from those of the resistor strings of group B, fine comparators $N_1$, $N_2$ and $N_3$ should be accordingly interchanged when the different groups are connected by the respective switch assemblies $A_{ij}$. In the illustrated embodiment, digital outputs $D_1$ and $D_0$ are inverted in response to the value of bit $D_2$ from upper bit encoder ENCM, rather than physically interchanging fine comparators $N_1$, $N_2$ and $N_3$.

In the above second example in which analog input voltage $V_{in}$ is equal to an electric potential at the connection point between resistors $R_9$ and $R_{10}$, as shown at point 2 in FIG. 3, as described above, upper bit encoder ENCM will generate control signal $P_2$ equal to "H_2" to couple resistors $R_9$ to $R_{11}$ to fine comparators $N_1$, $N_2$ and $N_3$.

However, in the second example, when the analog-to-digital converter is formed on an integrated circuit chip, the distance on the chip from the resistor $R_8$ to point 2 is the same as the distance from the resistor $R_7$ to point 1 of the first example, and the voltage differences are the same. Accordingly, digital outputs $D_0$ and $D_1$ must be inverted to become "1" and "0", respectively.

According to the analog-to-digital converter of the present invention, reference voltages $V_0$ to $V_{15}$ are divided into four groups comprising $V_0$ to $V_3$, $V_4$ to $V_7$, $V_8$ to $V_{11}$ and $V_{12}$ to $V_{15}$. Each of voltages $V_4$, $V_8$ and $V_{12}$, representing the four groups, is compared with analog input voltage $V_{in}$ to derive the upper two bits $D_2$ and $D_3$ of the digital output. Voltage groups $V_k$ to $V_{k-3}$ (were k equals 3, 7, 11 and 15) are selected in response to the upper two bits $D_2$ and $D_3$. Voltages $V_k$ to $V_{k-2}$ are then compared with analog input voltage $V_{in}$ to derive lower 2-bits $D_0$ and $D_1$ of the digital output.

Accordingly, the analog-to-digital converter of the present invention uses fewer comparators as compared to the parallel-type analog-to-digital converter of the prior art. If there are m upper bits of digital output and n lower bits of digital output, the number of coarse comparators is $2^m - 1$ and the number of fine comparators is $2^n - 1$. Since voltage comparators $A_{ij}$ are first stage-circuits in fine comparators $N_1$ to $N_3$ and also switching elements, the number of transistors used is also reduced. Both the semiconductor pellet size and the power consumption can be accordingly reduced when the analog-to-digital converter of the present invention is formed as an integrated circuit.

Since reference voltages $V_0$ to $V_{15}$ are used for deriving both the upper bits $D_2$ and $D_3$ and the lower bits $D_0$ and $D_1$, the likelihood of an error between the upper bits $D_2$ and $D_3$ and the lower bits $D_0$ and $D_1$ is significantly reduced, unlike prior art serial-to-parallel analog-to-digital converters, where an error between the front and rear stages can produce an error between the upper bits derived from the front stage and the lower bits derived from the rear stage.

In a preferred embodiment, the analog-to-digital converter of FIG. 3 can be made of bipolar transistors with a high driving frequency, so that an analog video signal can be converted to a digital output. Bipolar transistors are also superior to metal oxide semiconductor-field effect transistors, since MOS-FETs have a slow switching operation without producing an increase in the accuracy of the comparator.

Figure 5:
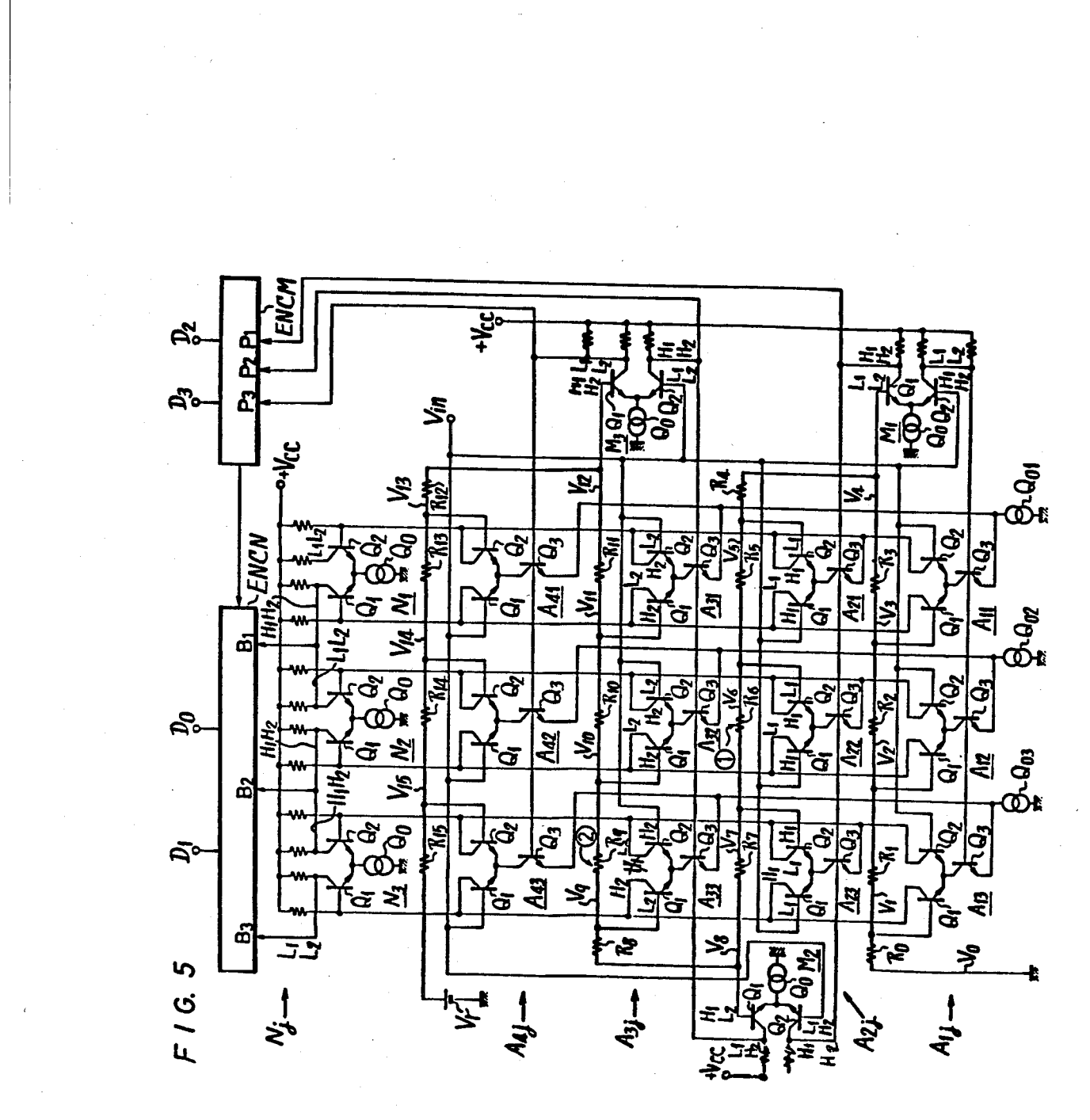

FIG. 5 illustrates a desirable circuit arrangement according to the invention in which the coarse comparator $M_2$ of the analog-to-digital converter of FIG. 3 has been moved to the opposite or left-hand side of the comparators $A_{ij}$, and the lower bit encoder ENCM has been moved to a position adjacent upper bit encoder ENCN. The illustrated arrangement of the analog-to-digital converter on an integrated circuit chip results in a more compact analog-to-digital converter than the one depicted in FIG. 3, and also decreases parasitic capacities between signal lines.

Figure 6:
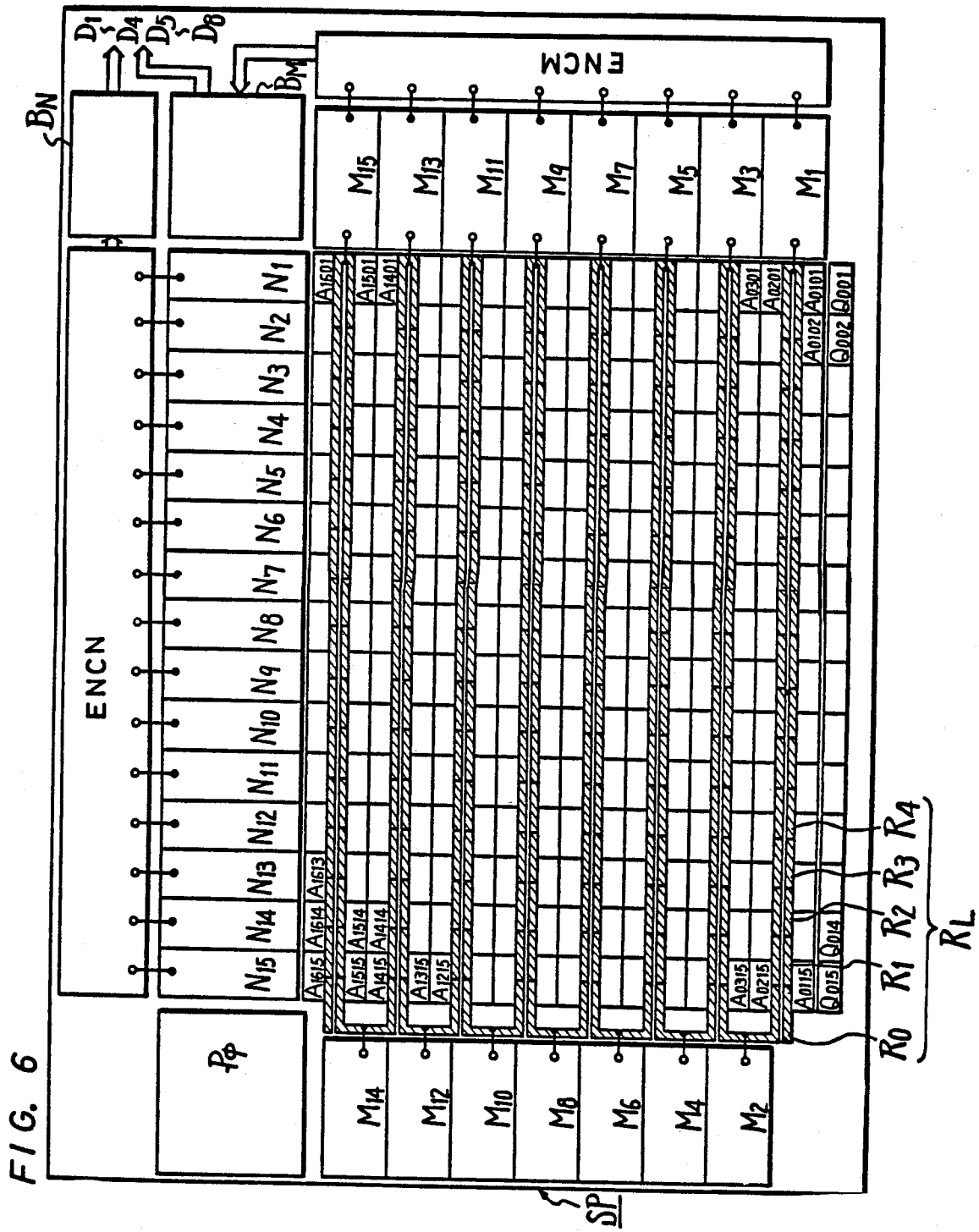
FIG. 6 is a block diagram illustrating an arrangement of circuit elements on an integrated circuit chip of an analog-to-digital converter in accord with the present invention.

FIG. 6 illustrates an arrangement of elements in a circuit on a semiconductor chip SP for an 8-bit analog-to-digital converter in accord with the present invention. Analog input voltage $V_{in}$ is converted to an upper 4 bit output and a lower 4 bit output. Accordingly, the illustrated circuit includes $2^8 = 256$ resistors $R_i$ (i equals 0 to 255), $2^4 = 15$ each of coarse and fine comparators $M_i$ and $N_i$ (i equals 1 to 15), and $2^8 = 256$ voltage comparators $A_{ij}$ (i equals 1 to 16 and j equals 1 to 15) for comparing analog input voltage $V_{in}$ with reference voltages $V_0$ to $V_{255}$. In one embodiment, semiconductor chip SP has dimensions of 3.95 mm × 5.35 mm.

A resistor layer RL of uniform width made of, for example, an aluminum evaporating film is formed on the surface of semiconductor chip SP. Resistor layer RL is formed in a zigzag pattern with sixteen parallel rows having turns between each row. In the embodiment of FIG. 6, one pair of adjacent straight line portions of resistor layer RL forms a group, with each pair of rows spaced apart from adjacent pairs of rows.

Resistor layer RL comprises a series connection of resistors $R_0$ to $R_{255}$. Corresponding reference voltages $V_0$ to $V_{255}$ are developed at corresponding points along resistor layer RL. In the illustrative embodiment, each straight line portion of resistor layer RL corresponds to $2^4 = 16$ resistors selected from resistors $R_0$ to $R_{255}$. Accordingly, each turn of resistor layer RL corresponds to a turn in the series circuit of resistors $R_0$ to $R_{15}$ depicted in FIG. 1. Reference voltages $V_{16}$, $V_{32}$,..., $V_{224}$ $V_{240}$, are developed at each turn, corresponding to every $2^4 = 16$ step within resistor layer RL.

Voltage comparators $A_{ij}$ are formed adjacent straight line rows of resistor layer RL. Voltage comparators $A_{ij}$ (i equals 2 to 15 and j equals 1 to 15) are positioned between adjacent rows of resistor layer RL. Voltage comparators $A_{1j}$ and $A_{16j}$ (j equals 1 to 15) are formed on the outer perimeter of resistor layer RL. Coarse comparators $M_1$, $M_3$, $M_5$, $M_7$, $M_9$, $M_{11}$, $M_{13}$ and $M_{15}$ are formed on the right hand side of resistor layer RL, and are connected to the respective turns of resistor layer RL. Coarse comparators $M_2$, $M_4$, $M_6$, $M_8$, $M_{10}$, $M_{12}$ and $M_{14}$ are formed on the left hand side of resistor layer RL, and are also connected to corresponding turns of resistor layer RL. Fine bit comparators $N_1$ to $N_{15}$ are arranged in a row parallel to the successive rows of resistor layer RL and adjacent comparators $A_{16j}$ (j equals 1 to 15).

Lower bit encoder ENCN is positioned on semiconductor chip SP adjacent to fine bit comparators $N_1$ to $N_{15}$ and is coupled thereto. Coarse bit encoder ENCM is also formed on semiconductor chip SP and positioned adjacent coarse bit comparators $M_1$, $M_3$, $M_5$, $M_7$, $M_9$, $M_{11}$, $M_{13}$ and $M_{15}$. Constant current sources $Q_{001}$ to $Q_{015}$ are formed adjacent comparators $A_{1j}$ (j equals 1 to 15). A clock generator $P_\phi$ is also positioned on semiconductor pellet SP. Coarse bit encoder ENCM and fine bit encoder ENCN supply signals to buffer circuits $B_M$ and $B_N$, respectively, from which upper and lower bits $D_1$ to $D_8$ are derived. Bonding pads (not shown) can be formed on semiconductor chip SP outside the regions of coarse and fine bit encoders ENCM and ENCN, and can be connected with bonding wires to buffer circuits $B_N$ and $B_M$.

When resistor layer RL is formed in a zigzag resistor pattern as described above, an accurate analog-to-digital converter is produced since reference voltages $V_0$ to $V_{255}$ are determined by the positions of the resistors $R_0$ to $R_{225}$.

Figure 7:
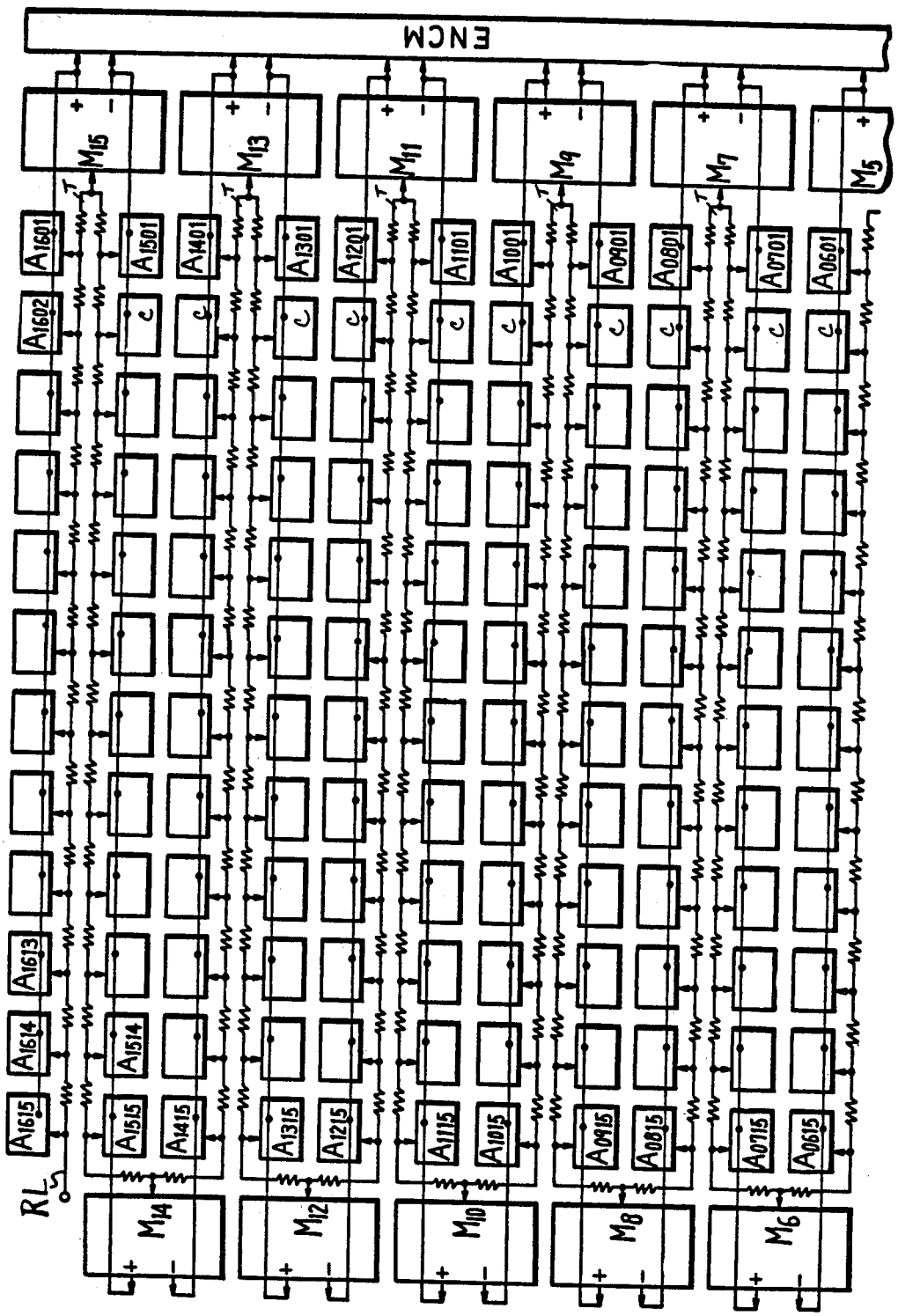
FIG. 7 is a detailed block diagram illustrating the analog-to-digital converter of FIG. 6.

FIG. 7 illustrates the connections of the elements of the 8-bit analog-to-digital converter of FIG. 6. Resistor layer RL is formed on semiconductor chip SP in a zigzag pattern of successive rows of resistors, with coarse comparators $M_1$ to $M_{15}$ formed at the respective turns T between the rows of resistors forming layer RL. Small black circles c in voltage comparators $A_{ij}$ correspond to the bases of transistors $Q_3$ (see FIG. 3) to which the outputs of coarse comparators $M_1$ to $M_{15}$ are supplied.

Coarse comparators $M_1$ to $M_{15}$ in an analog-to-digital converter of the present invention are pure voltage comparators and are connected with a waveform shaping circuit, such as a Schmitt circuit. Coarse comparators $M_1$ to $M_{15}$ occupy relatively large areas on semiconductor chip SP as compared to the other elements of the analog-to-digital converter. In an exemplary embodiment, coarse comparators $M_1$ to $M_{15}$ occupy about nine times as large an area as the voltage comparators $A_{ij}$.

Figure 8:
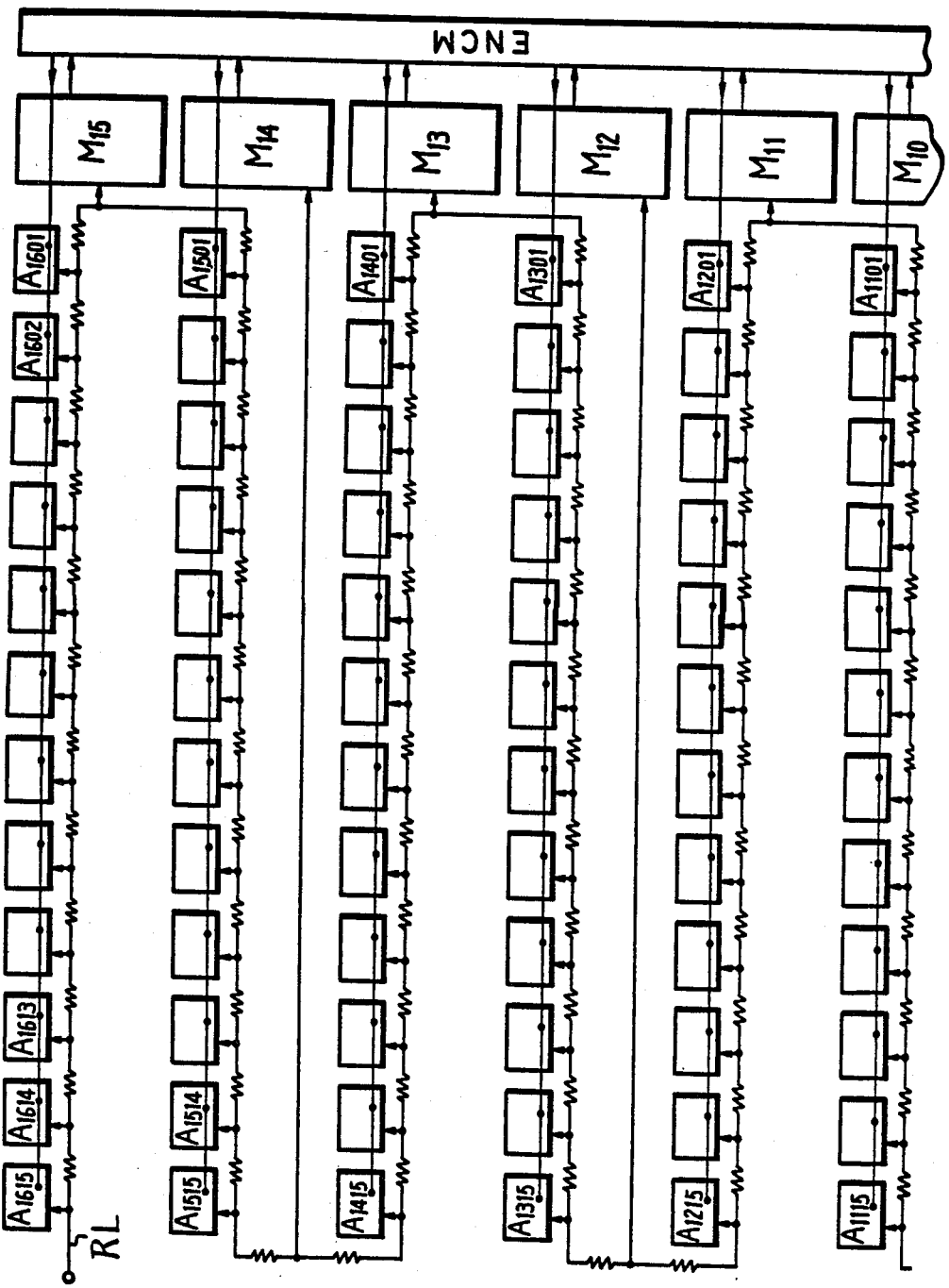
FIG. 8 is a sectional block diagram of an alternate arrangement of resistors and voltage comparators in an analog-to-digital converter and to which reference will be made in explaining the advantages thereover of the arrangements according to the invention.

If, as illustrated in FIG. 8, coarse comparators $M_1$ to $M_{15}$ are arranged in a single row on semiconductor chip SP, large gaps result between the rows of resistor layer RL and voltage comparators $A_{ij}$, no matter how close comparators $M_1$ to $M_{15}$ are positioned. In accord with the embodiment of the present invention illustrated in FIGS. 6 and 7, when coarse comparators $M_1$ to $M_{15}$ are formed at the turning points T of resistor layer RL, no significant gaps exist between the rows of resistor layer RL and voltage comparators $A_{ij}$, so that the size of semiconductor chip SP can be appropriately reduced.

When encoders ENCM and ENCN are positioned on semiconductor chip SP as illustrated in FIGS. 6 and 7, semiconductor chip SP can be about 5.4 mm in width $\times$ 4.0 mm in length, in one example.

Figure 9:
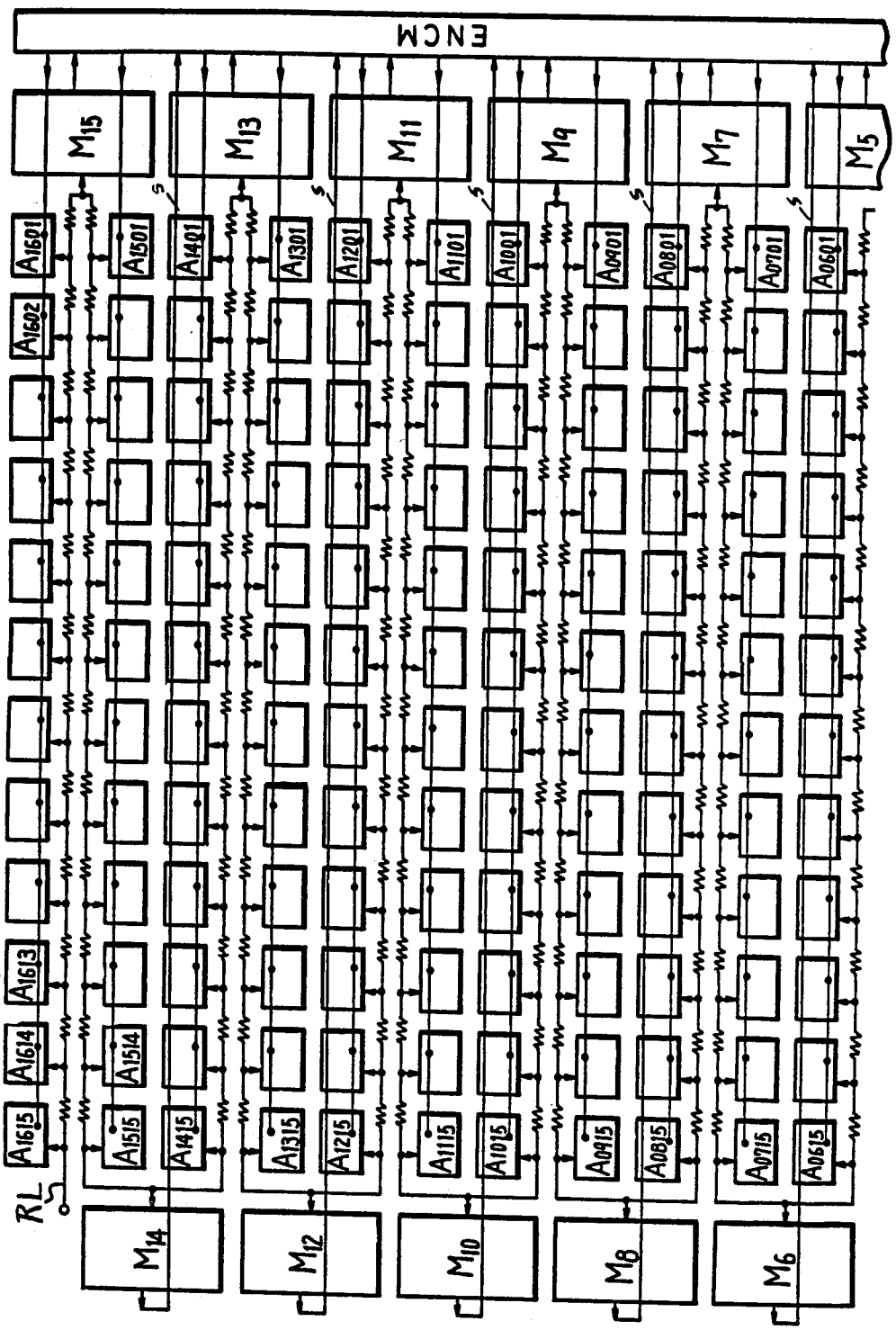
FIG. 9 is another sectional block diagram of an alternate arrangement of circuit elements of an analog-todigital converter on an integrated circuit chip, and to which reference will be made in explaining the advantages thereover of the arrangements according to the invention.

If coarse comparators $M_1$ to $M_{15}$ are merely positioned at each turning point T of resistor layer RL, i.e., at both sides of resistor layer RL, for example, as illustrated in FIG. 9, where coarse comparators $M_1$ to $M_{15}$ are positioned on both sides of resistor layer RL, with signal lines S supplying the outputs of coarse comparators $M_2$, $M_4$, $M_6$, $M_8$, $M_{10}$, $M_{12}$ and $M_{14}$ to coarse bit encoder ENCM, the long signal lines S create parasitic capacities which result in significant operating difficulties.

An analog-to-digital converter of the present invention has a wired-AND between a collector of transistor $Q_{m1}$ of voltage comparators $M_k$ (where k equals 1 to 14) and a collector of transistor $Q_{m2}$ and the succeeding voltage comparator $M_{k+1}$ (k equals 1 to 14). The AND output is supplied to coarse encoder ENCM and transistor $Q_3$ of voltage comparators $A_{ij}$. With coarse comparators $M_1$ to $M_{15}$ formed on both sides of resistor layer RL, signal lines S are reduced in length, so that parasitic capacities are unlikely to pose a significant problem.

An analog-to-digital converter iin accord with the present invention has small power consumption and operates at high speed. Further, the size of the integrated circuit chip can also be significantly reduced.

Although specific embodiments of the present invention have been described in detail herein with reference to the accompanying drawings, it is to be understood that the invention is not limited to those precise embodiments, and that various changes and modifications may be effected therein by one skilled in the art without departing from the spirit and scope of the invention as defined in the appended claims.

What is claimed is:

1. An analog-to-digital converter for converting an analog input signal to a digital output signal with m upper bits and n lower bits in a single step, comprising:
 a plurality of resistor means connected in a series circuit to a voltage source for establishing $(2^{m+n}-1)$ reference voltages at corresponding points on said series circuit;
 $(2^m-1)$ upper bit comparators for generating a pluarality of upper output signals indicative of said m upper bits, each upper bit comparator having a first input receiving said analog input signal and a second input connected to a selected one of said points to receive the corresponding reference voltage, adjacent ones of said selected points defining therebetween groups of reference voltages;
 upper bit encoder means responisve to said upper output signals for generating said m upper bits;
 $(2^n-1)$ lower bit comparators for generating a plurality of lower output signals indicative of said n lower bits and having respective first and second inputs;
 lower bit encoder means responisve to said lower output signals for generating said n lower bits; and
 switch means including $(2^{m+n}-1)$ switching elements each having a first input receiving said analog input signal and a second input receiving a corresponding one of said reference voltages, the switching elements receiving the reference voltages of said groups constituting corresponding groups of switching elements;
 said switch means being responsive to said upper output signals to enable a selected group of switching elements, and said enabled switching elements generating $(2^n-1)$ complementary first and second switching signals supplied to said first and second inputs, respectively, of said $(2^n-1)$ lower bit comparators.

2. The analog-to-digital converter of claim 1; wherein each of said upper and lower bit comparators and said switching elements of said switch means includes by a plurality of bipolar transistors.

3. The analog-to-digital converter of claim 2; wherein said bipolar transistors of each of said comparators and said switching elements of said switch means include a differentially connected pair thereof.

4. The analog-to-digital converter of claim 1; wherein said resistor means are arranged in a configuration with at least two sides, and wherein at least one of said upper bit comparators is positioned on each of said sides of said resistor means configuration.

5. The analog-to-digital converter of claim 4; wherein said resistor means configuration is a zigzag pattern with at least one turn, and wherein at least one of said upper bit comparators is positioned adjacent said at least one turn.

6. The analog-to-digital converter of claim 5, in which said two sides of said resistor means configuration are opposed; and wherein said zigzag pattern comprises successive rows of resistor means with turns between said rows, and alternate ones of said turns are positioned at said opposite sides of said resistor means configuration.

7. The analog-to-digital converter of claim 6; wherein said upper bit comparators are coupled to said series circuit at said turns.

8. The analog-to-digital converter of claim 7; wherein said rows of resistor means are parallel.

9. The analog-to-digital converter of claim 8; wherein said resistor means are formed as an integrated circuit on a semiconductor chip.

10. The analog-to-digital converter of claim 9; wherein said lower bit comparators are formed as said integrated circuit on said semiconductor chip.

11. The analog-to-digital converter of claim 10; wherein said upper bit comparators are formed as said integrated circuit on said semiconductor chip.

12. The analog-to-digital converter of claim 8; wherein each of said comparators and said switching elements of said switch means includes a plurality of bipolar transistors.

13. The analog-to-digital converter of claim 12; wherein said bipolar transistors of each of said comparators and said switching elements of said switch means are arranged in a differentially connected pair thereof.

14. The analog-to-digital converter of claim 1; wherein the number of said lower bits equals the number of said upper bits, and the number of said upper bit comparators equals the number of said lower bit comparators.

15. The analog-to-digital converter of claim 1 further comprising means supplied with said upper output signals for deriving switch control signals indicative of said m upper bits, said switch control signals being supplied to said switch means to control the selection of said groups of switching elements.

16. The analog-to-digital converter of claim 15; wherein said switch control signals are also supplied to said upper bit encoder means.

17. An integrated circuit analog-to-digital converter for converting an analog input signal to a digital output signal with m upper bits and n lower bits in a single step, comprising:
a plurality of resistor means connected in a series circuit to a voltage source in a configuration having two opposed sides for establishing $(2^{m+n}-1)$ reference voltages at corresponding points on said series circuit;
$(2^m-1)$ upper bit comparators for generating a plurality of upper output signals indicative of said m upper bits, each upper bit comparator having a first input receiving said analog input signal and a second input connected to a selected one of said points to receive the corresponding reference voltage, adjacent ones of said selected points defining therebetween groups of reference voltages, and said upper bit comparators being connected to said points to lie in two sets on said tow sides;
upper bits encoder means responsive to said upper output signals for generating said m upper bits;
$(2^n-1)$ lower bit comparators for generating a plurality of lower output signals indicative of said n lower bits and having respective first and second inputs;
lower bit encoder means responsive to said lower output signals for generating said n lower bits; and
switch means including $(2^{m+n}-1)$ switching elements each having a first input receiving said analog input signal and a second input receiving a corresponding one of said reference voltages, the switching elements receiving the reference voltages of said groups constituting corresponding groups of switching elements;
said switch means being responsive to said upper output signals to enable a selected group of switching elements, and said enabled switching elements generating $(2^n-1)$ complementary first and second switching signals supplied to said first and second inputs, respectively, of said $(2^n-1)$ lower bit comparators.

18. The analog-to-digital converter of claim 17; wherein said resistor means configuration is a zigzag pattern with at least one turn, and wherein at least one of said upper bit comparators is positioned adjacent said at least one turn.

19. The analog-to-digital converter of claim 18, in which said two sides of said resistor means configuration are opposed, and wherein said zigzag pattern comprises successive rows of resistor means with turns between said rows, said points being positioned at said turns, and alternate ones of said turns being positioned at said opposite sides of said resistor means configuration such that said upper bit comparators lie in alternating fashion on said opposite sides adjacent said turns.

20. An analog-to-digital converter formed as an integrated circuit on a semiconductor chip for converting an analog input voltage to a digital output signal with m upper bits and n lower bits in a single step, comprising:
a plurality of resistor means connected in a series circuit and connected to voltage source for producing $(2^{m+n}-1)$ step reference voltages, said step reference voltages being ordered in $(2^m-1)$ sequential groups each having a representative step reference voltage, and said series circuit being arranged to lie in a folded pattern of sections, with turning points between adjacent sections;

($2^{m+n}-1$) voltage comparison means each receiving a respective reference voltage;

($2^n-1$) first voltage comparators formed at and connected to respective turning points, each of said first voltage comparators receiving said analog input voltage and one of said representative step reference voltages for comparison therebetween and ordered in accordance with the group including the respective step reference voltage, each first voltage comparator producing first and second complementary outputs;

means for adding the first output of each first voltage comparator with the second output of the next higher order first voltage comparator to produce respective added outputs;

($2^m-1$) second voltage comparators;

first encoder means responsive to said added outputs to derive the upper m bits of said digital output;

means responsive to said added outputs for selecting a group of said voltage comparison means corresponding to a value of said m upper bits, each of said voltage comparison means within the selected group comparing its respective step reference voltage with said analog input voltage producing compared outputs;

said second voltage comparators being responsive to said compared outputs for producing output signals; and lower encoder means responsive to said output signals for deriving said lower n bits of said digital output.

21. The analog-to-digital converter of claim 20; wherein said bipolar transistors of each of said upper and lower bit comparators and said means for supplying include a differentially connected pair thereof.

22. The analog-to-digital converter of claim 20, wherein said first voltage comparators are divided into two groups, and are formed at positions corresponding to said turning points of said series circuit on oppoiste sides of said circuit.

23. The analog-to-digital converter of claim 20, wherein said voltage comparison means and said first and second voltage comparators respectively include bipolar transistors.

24. The analog-to-digital converter of claim 23, wherein said first voltage comparators function as primary comparators for said second voltage comparators.

25. The analog-to-digital converter of claim 23, wherein each of said voltage comparison means and said first and second voltage comparators are respectively formed of differential bipolar transistor pairs.

* * * * *